(12) United States Patent
Chen et al.

(10) Patent No.: US 12,129,341 B2
(45) Date of Patent: Oct. 29, 2024

(54) PREPARATION METHOD FOR POLYSILOXANE POWDER FILLER, POLYSILOXANE POWDER FILLER OBTAINED THEREBY AND APPLICATION THEREOF

(71) Applicant: Zhejiang Third Age Material Technology Co., Ltd., Zhejiang (CN)

(72) Inventors: Shuzhen Chen, Zhejiang (CN); Rui Li, Zhejiang (CN)

(73) Assignee: Zhejiang Third Age Material Technology Co., Ltd., Zhejiang (CN)

( * ) Notice: Subject to any disclaimer, the term of this patent is extended or adjusted under 35 U.S.C. 154(b) by 646 days.

(21) Appl. No.: 17/430,573

(22) PCT Filed: Sep. 29, 2019

(86) PCT No.: PCT/CN2019/109108
§ 371 (c)(1),
(2) Date: Aug. 12, 2021

(87) PCT Pub. No.: WO2020/168719
PCT Pub. Date: Aug. 27, 2020

(65) Prior Publication Data
US 2022/0135745 A1    May 5, 2022

(30) Foreign Application Priority Data

Feb. 22, 2019  (WO) ................ PCT/CN2019/075831

(51) Int. Cl.
*C08G 77/00* (2006.01)
*C08G 77/12* (2006.01)
*C08J 3/12* (2006.01)

(52) U.S. Cl.
CPC ............ *C08G 77/70* (2013.01); *C08G 77/12* (2013.01); *C08J 3/12* (2013.01); *C08J 2383/05* (2013.01)

(58) Field of Classification Search
USPC ......................................................... 528/31
See application file for complete search history.

(56) References Cited

FOREIGN PATENT DOCUMENTS

| CN | 1674325 A | * | 9/2005 | ............. A23B 4/015 |
|----|-----------|---|--------|-------------------------|
| CN | 101627043 A | | 1/2010 | |
| CN | 106609039 A2 | | 5/2019 | |
| EP | 0679677 A2 | | 11/1995 | |
| TW | 457276 B1 | * | 10/2014 | ............... C08K 9/04 |

OTHER PUBLICATIONS

CN-1674325-A Machine Translation (Year: 2005).*
TW457276 Machine Translation (Year: 2001).*

* cited by examiner

*Primary Examiner* — Terressa Boykin
(74) *Attorney, Agent, or Firm* — Olive Law Group, PLLC

(57) ABSTRACT

Disclosed is a preparation method for a polysiloxane powder filler. The method comprises: providing polysiloxane which contains at least 60 wt % of T unit, wherein T unit is equal to $R_1SiO_{3-}$, $R_1$ is a hydrogen atom or an independently selected organic group comprising 1-18 carbon atoms; and performing heat treatment on the polysiloxane under inert gas atmosphere or vacuum conditions, wherein the heat treatment temperature is 250 to 750 degrees, such that silicon hydroxyl groups in the polysiloxane are condensed to obtain a polysiloxane powder filler having a true density greater than or equal to 1.33 g/cm$^3$ and more preferably greater than or equal to 1.34 g/cm$^3$. The polysiloxane powder filler obtained by the described preparation method has low inductivity, low inductivity loss and low radioactivity; and can be used for semiconductor packaging materials, circuit boards and intermediate semi-finished products thereof, and semi-cured sheets or copper clad laminates of high-frequency high-speed circuit boards.

10 Claims, No Drawings

PREPARATION METHOD FOR POLYSILOXANE POWDER FILLER, POLYSILOXANE POWDER FILLER OBTAINED THEREBY AND APPLICATION THEREOF

This application is a 371 of international PCT/CN2019/109108, filed Sep. 29, 2019, which claims priority to international PCT/CN2019/075831, filed Feb. 22, 2019, the contents of each of which are hereby incorporated by reference.

BACKGROUND OF THE INVENTION

1. Field of the Invention

The invention relates to the packaging of semiconductors, and more specifically to a preparation method for a polysiloxane powder filler, the polysiloxane powder filler obtained thereby and application thereof.

2. Related Art

During the packaging of the semiconductor back-end process, packaging materials such as molding compounds, patch glues, underfill materials and chip carriers are required. In addition, when assembling passive components, semiconductor components, electro-acoustic devices, display devices, optical devices and radio frequency devices into equipments, circuit boards such as high-density interconnects (HDI), high-frequency high-speed boards, and motherboards are also required. These packaging materials and circuit boards are mainly composed of fillers and organic polymers such as epoxy resin, aromatic polyether and fluororesin. The filler is mainly silica, whose function is to reduce the coefficient of thermal expansion and inductivity loss. The silica is tightly packed and graded to provide the existing filler. The chemical structure of silica is the Q unit of Si, namely $SiO_{4/2}$.

On the one hand, with the advancement of technology, the signal frequency used by semiconductors is getting higher and higher, and the high-speed low-loss signal transmission requires fillers with low inductivity and low inductivity loss. On the other hand, the inductivity (also known as permittivity) and inductivity loss (also known as permittivity loss) of a material basically depend on the chemical composition and structure of the material. Silica has its inherent inductivity and inductivity loss. Therefore, the existing silica fillers cannot meet the requirements of lower inductivity and low inductivity loss.

For semiconductor memory, low radioactivity is required for the filler. However, the purity of the existing silica largely depends on the purity of the natural mineral itself. Therefore, the existing silica filler cannot fully meet the requirement of low radioactivity.

It is known that polysiloxane has low inductivity and is a commonly used industrial insulating material. However, there is usually a large room for water absorption inside the existing polysiloxane filler powder, and the inductivity loss will increase when the filler absorbs water, wherein the water absorption under atmospheric conditions causes weight gain. Thus, the existing filler is not suitable for applications such as semiconductor packaging or circuit boards with requirement of low inductivity loss. For example, Tospearl120 produced by Momentive is a polymethylsiloxane with an average particle size of 2 microns, whose weight loss after heating at 200 degrees for 2 hours is about 1%, and the water absorption problem is serious.

SUMMARY OF THE INVENTION

The present invention aims to provide a preparation method for a polysiloxane powder filler, the polysiloxane powder filler obtained thereby and application thereof. The provided filler has low inductivity, low inductivity loss and low radioactivity.

The present invention provides a preparation method for a polysiloxane powder filler, comprising the steps of: S1, providing polysiloxane which contains at least 60 wt % of T unit, wherein T unit=$R_1SiO_{3/2}$, $R_1$ is a hydrogen atom or an independently selected organic group comprising 1-18 carbon atoms; and S2, performing heat treatment on the polysiloxane under inert gas atmosphere or vacuum conditions, wherein the heat treatment temperature is 300 to 700 degrees, such that silicon hydroxyl groups in the polysiloxane are condensed to obtain a polysiloxane powder filler having a true density greater than or equal to 1.33 $g/cm^3$.

Different from the existing polysiloxane filler powder, the polysiloxane powder filler obtained by the above preparation method of the present invention has a moisture weight loss less than 0.1% after heating at 200 degrees for 2 hours, and inductivity loss less than 0.005 at 500 MHz, suitable for applications such as semiconductor packaging or circuit boards with requirement of low inductivity loss. Different from the existing silica fillers containing only Q unit, the polysiloxane powder filler of the present invention comprises T unit. The introduction of organic group R can greatly reduce the inductivity, and at the same time, the powder is heat-treated under inert gas atmosphere or vacuum conditions to increase the true density, reduce the room for water absorption inside the powder, reduce water absorption, and ultimately greatly reduce the inductivity loss. Specifically, the organic group may be oxidized and decomposed to form a polar group if the heating treatment under air atmosphere, but the heat treatment of the present invention is performed under inert gas atmosphere or vacuum conditions in order to avoid such oxidation problem. In the present invention, the heat treatment temperature is specifically limited to 300 degrees or more to promote the condensation reaction of silanol groups. The higher the temperature, the faster and more sufficient the condensation is. But the heat treatment temperature of the present invention is specifically limited to 700 degrees or less to avoid thermal decomposition of carbosilane itself.

In the present invention, the true density is relative to the bulk density of the particle group, which refers to the actual mass of a solid substance per unit volume in an absolutely dense state. That is to say, the true density is the density after removing internal pores or voids between particles. Commonly used methods to determine true density are mainly gas volume method and immersion method (pycnometer method). The true density of the present invention is measured by the gas volume method, wherein the gas is helium, with reference to ISO 12154-2014.

Preferably, in the step S2, the heat treatment on the polysiloxane is performed under inert gas atmosphere or vacuum conditions, wherein the heat treatment temperature is 300 to 700 degrees, such that silicon hydroxyl groups in the polysiloxane are condensed to obtain the polysiloxane powder filler having a true density greater than or equal to 1.34 $g/cm^3$. In preferred embodiments, the true density of the polysiloxane powder filler is between 1.33-1.38 $g/cm^3$, especially between 1.34-1.35 $g/cm^3$.

Preferably, in the step S1, the polysiloxane is prepared by a reaction of methyltrichlorosilane and water. The chemical activity of the chlorine atom substituent is high, the hydrolysis and condensation reaction are fast, and the methyltrichlorosilane is cheap.

Preferably, the polysiloxane contains 90 wt %-100 wt % of T unit. More preferably, the polysiloxane contains 99 wt %-100 wt % of T unit. It should be understood that the content of the T unit (i.e., wt %, weight percentage) can ensure that the true density of the polysiloxane powder filler is increased as much as possible under the premise of introducing organic groups, so as to reduce the room for water absorption inside the polysiloxane powder filler, and thus reduce water absorption. Of course, the polysiloxane can also contain D unit and/or M unit to reduce hardness and wear during processing. Q unit can also be contained to reduce the thermal expansion coefficient. Q unit=$SiO_{4-}$, D unit=$R_2R_3SiO_{2-}$, M unit=$R_4R_5R_6SiO_{2-}$, each of $R_2$, $R_3$, $R_4$, $R_5$, and $R_6$ is a hydrogen atom or an independently selected hydrocarbyl comprising 1-18 carbon atoms.

Preferably, $R_1$ in the T unit is methyl. In a preferred embodiment, the polysiloxane is polymethylsiloxane.

Preferably, the heat treatment temperature in step S2 is between 350-650 degrees. It should be understood that when the temperature is higher, the required time is shorter, and when the temperature is lower, the required time is longer. In preferred embodiments, the heat treatment time is between 1 hour and 20 hours.

Preferably, the preparation method further comprises treating the polysiloxane powder filler on surface by a treatment agent to promote the affinity between the polysiloxane powder filler and the organic polymer.

Preferably, the treatment agent includes a silane coupling agent, which is $(R_7)_a(R_8)_bSi(M)_{4-a-b}$, wherein each of $R_7$, $R_8$ is a hydrogen atom, an independently selected hydrocarbyl comprising 1-18 carbon atoms, or an independently selected hydrocarbyl comprising 1-18 carbon atoms replaced by functional groups, wherein the functional group is at least one group selected from following organic functional groups: vinyl, allyl, styryl, epoxy group, aliphatic amino, aromatic amino, methacryloxypropyl, acryloxypropyl, ureidopropyl, chloropropyl, mercaptopropyl, polysulfide group, isocyanate propyl, M is an alkoxy group comprising 1-18 carbon atoms or a halogen atom, a=0, 1, 2 or 3, b=0, 1, 2 or 3, and a+b=1, 2 or 3.

Preferably, the silane coupling agent is a silane coupling agent with free radical polymerization reaction, such as vinyl silane coupling agent; a silane coupling agent reacting with epoxy resin, such as epoxy silane coupling agent or amino silane coupling agent; a hydrocarbyl silane coupling agent with high affinity to hydrophobic resins, such as dimethyldimethoxysilane, diphenyldimethoxysilane, phenylsilane coupling agent, or long-chain alkyl silane coupling agent. More preferably, the silane coupling agent is at least one coupling agent selected from following groups: dimethyldimethoxysilane, phenyltrimethoxysilane, and vinyltrimethoxysilane.

Preferably, the treatment agent includes disilazane, which is $(R_9R_{10}R_{11})SiNHSi(R_{12}R_{13}R_{14})$, wherein each of $R_9$, $R_{10}$, $R_{11}$, $R_{12}$, $R_{13}$, $R_{14}$ is a hydrogen atom or an independently selected hydrocarbyl comprising 1-18 carbon atoms. More preferably, the disilazane is hexamethyldisilazane.

Preferably, the weight percentage of the treatment agent is 0.5-10 wt %. In preferred embodiments, the weight percentage of the treatment agent is 0.5-5 wt %. In a preferred embodiment, the weight percentage of the treatment agent is 2 wt %. In a preferred embodiment, the silicon hydroxyl groups are condensed by heating at 130 degrees for 6 hours.

Preferably, the preparation method comprises removing coarse oversize particles above 75 microns in the polysiloxane powder filler by dry or wet sieving or inertial classification. Preferably, coarse oversize particles above 55 microns in the polysiloxane powder filler are removed. Preferably, coarse oversize particles above 45 microns in the polysiloxane powder filler are removed. Preferably, coarse oversize particles above 20 microns in the polysiloxane powder filler are removed. Preferably, coarse oversize particles above 10 microns in the polysiloxane powder filler are removed. Preferably, coarse oversize particles above 5 microns in the polysiloxane powder filler are removed. Preferably, coarse oversize particles above 3 microns in the polysiloxane powder filler are removed. Preferably, coarse oversize particles above 1 micron in the polysiloxane powder filler are removed.

The present invention also provides a polysiloxane powder filler obtained by above preparation method, wherein the polysiloxane powder filler has a particle size of 0.1-50 microns. Preferably, the particle size is 0.5-30 microns.

The measurement results show that the inductivity of the polysiloxane powder filler of the present invention at 500 MHz is only 2.5-2.8, which is less than 3, while the inductivity of the existing silica filler of Q unit is about 3.8-4.5. Therefore, the polysiloxane powder filler of the present invention has a greatly reduced inductivity, and can meet the material requirement of high-frequency signal in the 5G era.

The present invention also provides an application of the above-mentioned polysiloxane powder filler, wherein the polysiloxane powder filler of different particle sizes is tightly packed and graded in resin to form a composite material. Preferably, the composite material is suitable for semiconductor packaging materials, circuit boards and intermediate semi-finished products thereof, and semi-cured sheets or copper clad laminates (CCL) of high-frequency high-speed circuit boards. Preferably, the packaging material is molding compound, patch glue, underfill material, or chip carrier. The molding compound is DIP package molding compound, SMT package molding compound, MUF, FO-WLP, FCBGA molding compound. Preferably, the circuit board is an HDI, a high-frequency high-speed board, or a motherboard.

It is known that the inductivity of the composite material can be approximately calculated by the following formula 1:

$$\log \varepsilon = V_1 \times \log \varepsilon_1 + V_2 \times \log \varepsilon_2 \quad \text{Formula 1:}$$

ε: the inductivity of the composite material
$V_1$: the volume fraction of the resin
$\varepsilon_1$: the inductivity of the resin
$V_2$: the volume fraction of the filler
$\varepsilon_2$: the inductivity of the filler.

Therefore, by adjusting the volume fraction of the resin and the polysiloxane powder filler, the inductivity of the composite material can be designed as required to form the packaging material, the circuit board and the intermediate semi-finished product thereof.

In addition, the inductivity loss of the composite material is determined by the inductivity loss of the resin and filler, and the number of polar groups on the surface of the filler. The polysiloxane powder filler according to the present invention has low inductivity and fewer polar groups on the surface of the filler, therefore, the composite material has low inductivity loss.

According to application requirements, the polysiloxane powder filler of the present invention can be used together with other fillers, such as silica, alumina, aluminum hydroxide, talc and the like.

In short, the polysiloxane powder filler obtained by the preparation method of the present invention has low inductivity and low inductivity loss. Moreover, since the raw materials of the preparation method are all organic without involving the conventionally used angular crushed quartz, etc., and the product can be refined by industrial methods such as distillation. The resulting polysiloxane powder filler does not contain radioactive elements such as uranium and thorium, meeting the requirement of no conductive impurity and low radioactivity. In addition, the synthesis parameters of the preparation method of the present invention can be appropriately adjusted to produce the polysiloxane powder filler with a particle size of 0.1-50 microns.

DESCRIPTION OF THE ENABLING EMBODIMENT

The preferred embodiments of the present invention are given below and described in detail.

The detection methods involved in the following embodiments include:

The average particle size was measured by a laser particle size distribution instrument HORIBA LA-700, and the solvent was isopropanol.

The specific surface area was measured by SHIMADZU FlowSorbIII2305.

The true density was measured by MicrotracBEL BELPycno, and the gas used for measurement was helium.

The weight loss after heating at 200 degrees for 2 hours was weighed by an analytical balance, and the heated sample was cooled in a dry air container and then weighed. The heated sample absorbed water to gain weight when placed in the atmosphere, indicating that the weight loss after heating was the water absorbed by the polysiloxane. The sample before the test was placed in the atmosphere for more than 1 hour to allow the sample to absorb water in the atmosphere to reach a saturated state. The atmosphere mentioned here refers to the natural atmosphere in the subtropical area.

The content of uranium and thorium was measured by Agilent 7700X ICP-MS. The sample was prepared by total dissolution in hydrofluoric acid after burning at 800 degrees.

The content of Q, T, D, or M unit was measured by solid $^{28}$Si-NMR nuclear magnetic resonance spectrum of JEOL ECS-400 Nuclear magnetic resonance instrument, wherein the Q unit content was calculated from the peak integrated area between −80 ppm and −120 ppm, the T unit content was calculated from the peak integrated area between −30 ppm and −80 ppm, the D unit content was calculated from the peak integrated area between −10 ppm and −30 ppm; and the M unit content was calculated from the peak integrated area between +20 ppm and −10 ppm; referring to *Separation and Purification Technology Volume 25, Issues* 1-3, 1 Oct. 2001, Pages 391-397, 29Si NMR and Si2p XPS correlation in polysiloxane membranes prepared by plasma enhanced chemical vapor deposition.

The inductivity or inductivity loss was measured by KEYCOM inductivity or inductivity loss measuring device Model No. DPS18 in perturbation method and sample hole block-shaped cavity resonance method.

In this text, temperature degree refers to "degrees Celsius", that is, ° C.

Referring to method of "Spherical Silicone Resin Micropowder", Huang Wenrun, Organic Silicone Materials, 2007, 21(5) 294-299, wherein the raw material was Methyltrimethoxysilane, and method of PCT/CN2018/124685, wherein the raw material was Methyltrichlorosilane, the spherical siloxane of different compositions in Examples and Comparative Examples was prepared for subsequent heat treatment.

Methyltrichlorosilane was added into water to provide a white precipitate. After being washed with deionized water, the precipitate was ground by a sand mill to a fine powder of 2 microns in Examples and Comparative Examples for subsequent heat treatment. Observed by an electron microscope, the prepared powder contains spherical polysiloxane.

Embodiment 1

The polysiloxane of 100% T unit ($R_1$ is methyl) with an average particle size of 2 microns was heat-treated at different temperatures in air or nitrogen atmosphere. The powder was separated by cyclone to remove coarse oversize particles above 10 microns to obtain samples of Examples and Comparative Examples. The analysis results of the samples were listed in Table 1.

TABLE 1

| | Average Particle Size μm | Heat Treatment Temperature ° C. | Heat Treatment Time h | Atmosphere | True density g/cm³ | Weight Loss after heating at 200° C. for 2 hours % | Inductivity 500 MHz | Inductivity Loss 500 MHz |
|---|---|---|---|---|---|---|---|---|
| Example 1 | 2.0 | 350 | 20 | nitrogen | 1.33 | 0.09 | 2.9 | 0.003 |
| Example 2 | 2.0 | 450 | 2 | nitrogen | 1.36 | 0.04 | 2.6 | <0.001 |
| Example 3 | 2.0 | 650 | 1 | nitrogen | 1.38 | 0.05 | 2.6 | <0.001 |
| Comparative Example 1 | 2.0 | 350 | 20 | air | 1.37 | 0.9 | 3.1 | 0.01 |
| Comparative Example 2 | 2.0 | 450 | 2 | air | 1.85 | 2.9 | 4.9 | 0.02 |
| Comparative Example 3 | 2.0 | 650 | 1 | air | 2.1 | 3.5 | 5.1 | 0.03 |
| Comparative Example 4 | 2.0 | commercial Tospearl120 | | | 1.32 | 1.2 | 2.9 | 0.009 |

Obviously, for each of the samples obtained according to Examples 1-3, the inductivity was less than 3 and the inductivity loss was less than 0.005, meeting the requirement of low inductivity (less signal delay) and low inductivity loss (less signal loss) of the filler in the 5G era. For each of the samples obtained by heat-treating in air atmosphere according to Comparative Examples 1-3, the inductivity was greater than 3 and the inductivity loss was greater than 0.005, and for the sample of Comparative Example 4, the inductivity loss was greater than 0.005, failing to meet the requirement of low inductivity (less signal delay) and low inductivity loss (less signal loss) of the filler in the 5G era.

Embodiment 2

The polysiloxane of 100% T unit ($R_1$ is methyl) with an average particle size of 2 microns was heat-treated in nitrogen atmosphere. The treated powder was treated with 0.5% vinyltrimethoxysilane, and then heated at 130° C. for 6 hours. The powder was separated by cyclone to remove coarse oversize particles above 10 microns to obtain the sample of Example 4. The analysis results of the sample were listed in Table 2.

The polysiloxane of 100% T unit ($R_1$ is vinyl) with an average particle size of 2 microns was heat-treated in nitrogen atmosphere. The treated powder was treated with a mixture of 1% phenyltrimethoxysilane and 1% hexamethyldisilazane (the weight of the treatment agent is equal to 2%), and then heated at 130° C. for 6 hours. The powder was separated by cyclone to remove coarse oversize particles above 10 microns to obtain the sample of Example 5. The analysis results of the sample were listed in Table 2.

TABLE 2

| | Average Particle Size μm | Heat Treatment Temperature ° C. | Heat Treatment Time h | Atmosphere | Weight Loss after heating at 200° C. for 2 hours % | True density g/cm³ | Inductivity 500 MHz | Inductivity Loss 500 MHz |
|---|---|---|---|---|---|---|---|---|
| Example 4 | 2.0 | 430 | 2 | nitrogen | 0.05 | 1.35 | 2.6 | <0.001 |
| Example 5 | 2.0 | 430 | 2 | nitrogen | 0.06 | 1.34 | 2.7 | <0.001 |

Obviously, for each of the samples obtained according to Examples 4-5, the inductivity was less than 3 and the inductivity loss was less than 0.005, meeting the requirement of low inductivity (less signal delay) and low inductivity loss (less signal loss) of the filler in the 5G era.

Embodiment 3

Methyltrichlorosilane was added into water to provide a white precipitate. After being washed with deionized water, the precipitate was ground by a sand mill to a fine powder of 2 microns. Observed by an electron microscope, the prepared powder contains spherical polysiloxane. After filtration and drying, the heat treatment was performed in nitrogen atmosphere. The treated powder was mixed and treated with 5% vinyl silane coupling agent, and then heated at 130° C. for 6 hours. The powder was separated by cyclone to remove coarse oversize particles above 10 microns to obtain the sample of Example 6. The analysis results of the sample were listed in Table 3.

TABLE 3

| | Average Particle Size μm | Heat Treatment Temperature ° C. | Heat Treatment Time h | Atmosphere | True density g/cm³ | Weight Loss after heating at 200° C. for 2 hours % | Inductivity 500 MHz | Inductivity Loss 500 MHz |
|---|---|---|---|---|---|---|---|---|
| Example 6 | 2.0 | 450 | 3 | nitrogen | 1.37 | 0.05 | 2.6 | <0.001 |

Obviously, for the sample obtained according to Example 6, the inductivity was less than 3 than 3 and the inductivity loss was less than 0.005, meeting the requirement of low inductivity (less signal delay) and low inductivity loss (less signal loss) of the filler in the 5G era.

Embodiment 4

The polysiloxane of 100% T unit ($R_1$ is methyl) with different average particle sizes was heat-treated at different temperatures in vacuum or nitrogen atmosphere. The powder was separated by a vibrating screen to remove coarse oversize particles above 45 microns to obtain samples of Examples 7-10. The analysis results of the samples were listed in Table 4.

TABLE 4

| | Average Particle Size μm | Heat Treatment Temperature ° C. | Heat Treatment Time h | Atmosphere | True density g/cm³ | Weight Loss after heating at 200° C. for 2 hours % | Inductivity 500 MHz | Inductivity Loss 500 MHz |
|---|---|---|---|---|---|---|---|---|
| Example 7 | 0.5 | 430 | 2 | nitrogen | 1.35 | 0.07 | 2.8 | 0.002 |
| Example 8 | 5.0 | 430 | 2 | nitrogen | 1.35 | 0.05 | 2.7 | <0.001 |
| Example 9 | 10 | 430 | 2 | nitrogen | 1.35 | 0.05 | 2.7 | <0.001 |
| Example 10 | 30 | 430 | 2 | vacuum | 1.34 | 0.04 | 2.6 | <0.001 |

Obviously, for each of the samples obtained according to Examples 7-10, the inductivity was less than 3 and the inductivity loss was less than 0.005, meeting the requirement of low inductivity (less signal delay) and low inductivity loss (less signal loss) of the filler in the 5G era. For each of the samples obtained by heat-treating in an air atmosphere according to Comparative Examples 1-4, the inductivity was greater than 3 and the inductivity loss was greater than 0.005, failing to meet the requirement of low inductivity (less signal delay) and low inductivity loss (less signal loss) of the filler in the 5G era.

It should be understood that samples of above Examples 1-10 can be vertex cut to remove coarse oversize particles. Specifically, coarse oversize particles above 1, 3, 5, 10, 20, 45, 55, or 75 μm in the polysiloxane powder filler can be removed by dry or wet sieving or inertial classification according to the size of the semiconductor chip. Further, Uranium or thorium content of samples of above Examples 1-10 was less than 0.5 ppb, wherein the samples were dissolved in hydrofluoric acid and measured by ICP-MS.

The foregoing description refers to preferred embodiments of the present invention, and is not intended to limit the scope of the present invention. Various changes can be made to the foregoing embodiments of the present invention. That is to say, all simple and equivalent changes and modifications made in accordance with the claims of the present invention and the content of the description fall into the protection scope of the patent of the present invention. What is not described in detail in the present invention is conventional technical content.

What is claimed is:

1. A preparation method for a polysiloxane powder filler, comprising the steps of:
    S1, providing polysiloxane which contains at least 60 wt % of T unit, wherein T unit=$R_1SiO_3^-$, R1 is a hydrogen atom or an independently selected organic group comprising 1-18 carbon atoms; and
    S2, performing heat treatment on the polysiloxane under inert gas atmosphere or vacuum conditions, wherein the heat treatment temperature is 300 to 700 degrees, such that the condensation reaction of silanol groups are promoted and thermal decomposition of carbosilane itself is avoided to obtain a polysiloxane powder filler having a true density greater than or equal to 1.33 g/cm³.

2. The preparation method according to claim 1, wherein in the step S2, the heat treatment on the polysiloxane is performed under inert gas atmosphere or vacuum conditions, wherein the heat treatment temperature is 300 to 700 degrees, such that silicon hydroxyl groups in the polysiloxane are condensed to obtain the polysiloxane powder filler having a true density greater than or equal to 1.33 g/cm³.

3. The preparation method according to claim 1, wherein in the step S1, the polysiloxane is prepared by a reaction of methyltrichlorosilane and water.

4. The preparation method according to claim 1, wherein the polysiloxane contains 90%-100% of T unit.

5. The preparation method according to claim 1, wherein R1 in the T unit is methyl.

6. The preparation method according to claim 1, wherein the preparation method further comprises treating the polysiloxane powder filler on surface by a treatment agent, wherein the treatment agent includes a silane coupling agent, which is (R7)a(R8)bSi(M)4-a-b, wherein each of R7, R8 is a hydrogen atom, an independently selected hydrocarbyl comprising 1-18 carbon atoms, or an independently selected hydrocarbyl comprising 1-18 carbon atoms replaced by functional groups, wherein the functional group is at least one group selected from following organic functional groups: vinyl, allyl, styryl, epoxy group, aliphatic amino, aromatic amino, methacryloxypropyl, acryloxypropyl, ureidopropyl, chloropropyl, mercaptopropyl, polysulfide group, isocyanate propyl, M is an alkoxy group comprising 1-18 carbon atoms or a halogen atom, a=0, 1, 2 or 3, b=0, 1, 2 or 3, and a+b=1, 2 or 3; and/or the treatment agent includes disilazane, which is (R9R10R11)SiNHSi(R12R13R14), wherein each of R9, R10, R11, R12, R13, R14 is a hydrogen atom or an independently selected hydrocarbyl comprising 1-18 carbon atoms.

7. The preparation method according to claim 1, wherein the preparation method comprises removing coarse oversize particles above 1, 3, 5, 10, 20, 45, 55 or 75 microns in the polysiloxane powder filler by dry or wet sieving or inertial classification.

8. The preparation method according to claim 1, wherein the polysiloxane powder filler has a particle size of 0.1-50 microns.

9. The preparation method according to claim 8, wherein the polysiloxane powder filler of different particle sizes is tightly packed and graded in resin to form a composite material.

10. The preparation method according to claim 9, wherein the composite material is suitable for semiconductor packaging materials, circuit boards and intermediate semi-finished products thereof, and semi-cured sheets or copper clad laminates of high-frequency high-speed circuit boards.

* * * * *